United States Patent
Ding et al.

(10) Patent No.: US 9,853,752 B2
(45) Date of Patent: Dec. 26, 2017

(54) METHOD AND SYSTEM FOR GENERATING A RECEIVED SIGNAL STRENGTH INDICATOR (RSSI) VALUE THAT CORRESPONDS TO A RADIO FREQUENCY (RF) SIGNAL

(71) Applicant: NXP B.V., Eindhoven (NL)

(72) Inventors: Jingfeng Ding, Gratwein (AT); Helmut Kranabenter, Graz (AT); Stefan Mendel, Graz (AT); Gernot Hueber, Linz (AT); Josef Zipper, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/087,037

(22) Filed: Mar. 31, 2016

(65) Prior Publication Data

US 2017/0288795 A1    Oct. 5, 2017

(51) Int. Cl.
  *H04B 17/00*  (2015.01)
  *H04B 17/318*  (2015.01)

(52) U.S. Cl.
  CPC .................. *H04B 17/318* (2015.01)

(58) Field of Classification Search
  CPC ...................................................... H04B 1/00
  USPC .................... 455/234.1, 136, 138
  See application file for complete search history.

(56) References Cited

U.S. PATENT DOCUMENTS

| | | | |
|---|---|---|---|
| 5,617,060 A | 4/1997 | Wilson et al. | |
| 6,038,435 A * | 3/2000 | Zhang | H03G 3/3052 375/345 |
| 6,052,566 A * | 4/2000 | Abramsky | H03G 3/3068 455/249.1 |
| 6,212,244 B1 | 4/2001 | Davidovici et al. | |
| 6,236,863 B1 * | 5/2001 | Waldroup | H03F 1/30 455/126 |
| 6,442,380 B1 | 8/2002 | Mohindra | |
| 7,245,893 B1 | 7/2007 | Husted et al. | |
| 7,672,359 B2 * | 3/2010 | Cleary | H03G 3/3078 375/147 |
| 7,995,684 B2 * | 8/2011 | Montojo | H03G 3/3036 375/130 |
| 8,582,694 B2 * | 11/2013 | Velazquez | H04B 1/001 330/151 |
| 9,473,161 B1 * | 10/2016 | Kern | H03M 3/486 |
| 2003/0045250 A1 * | 3/2003 | Haapoja | H04W 52/52 455/126 |

(Continued)

OTHER PUBLICATIONS

Extended European Search Report for Counterpart Patent Appln. 17155230.0 (dated Aug. 22, 2017).

(Continued)

*Primary Examiner* — Wen Huang (57) ABSTRACT

Embodiments of a method and a system for generating a received signal strength indicator (RSSI) value that corresponds to a radio frequency (RF) signal are disclosed. In an embodiment, a method for generating an RSSI value that corresponds to an RF signal involves obtaining an attenuation factor code in response to applying an automatic gain control (AGC) operation to the RF signal, obtaining an analog-to-digital converter (ADC) code in response to applying an ADC operation to a signal that results from the AGC operation, and combining the attenuation factor code and the ADC code to generate an RSSI value. Other embodiments are also described.

16 Claims, 10 Drawing Sheets

(56) References Cited

U.S. PATENT DOCUMENTS

2014/0329479 A1 11/2014 Shanan

OTHER PUBLICATIONS

Lee, S. et al. "Fast RSSI Circuit Using Novel Power Detector for Wireless Communication", IEEE International SoC Design Conference, pp. I-9-I-12 (Nov. 2008).

* cited by examiner

METHOD AND SYSTEM FOR GENERATING A RECEIVED SIGNAL STRENGTH INDICATOR (RSSI) VALUE THAT CORRESPONDS TO A RADIO FREQUENCY (RF) SIGNAL

BACKGROUND

Radio frequency (RF) communications devices typically need to support a wide dynamic range. For example, an RF communications device may need to cope with long distance communications with bad coupling conditions as well as close distance communications with good coupling conditions. Received signal strength indicator (RSSI) values can be used to adjust an RF communications device to cope with different communications conditions.

SUMMARY

Embodiments of a method and a system for generating an RSSI value that corresponds to an RF signal are disclosed. In an embodiment, a method for generating an RSSI value that corresponds to an RF signal involves obtaining an attenuation factor code in response to applying an automatic gain control (AGC) operation to the RF signal, obtaining an analog-to-digital converter (ADC) code in response to applying an ADC operation to a signal that results from the AGC operation, and combining the attenuation factor code and the ADC code to generate an RSSI value. Other embodiments are also described.

In an embodiment, combining the attenuation factor code and the ADC code to generate the RSSI value involves performing a bit shift operation on the attenuation factor code and the ADC code.

In an embodiment, the number of bits of the RSSI value is equal to the sum of the number of bits of the attenuation factor code and the number of bits of the ADC code.

In an embodiment, performing the bit shift operation on the attenuation factor code and the ADC code involves one of appending the attenuation factor code to the least significant bit (LSB) of the ADC code and appending the attenuation factor code to the most significant bit (MSB) of the ADC code.

In an embodiment, obtaining the attenuation factor code involves obtaining the attenuation factor code using a programmable resistive voltage divider.

In an embodiment, obtaining the attenuation factor code involves obtaining the attenuation factor code using a programmable capacitive voltage divider.

In an embodiment, the method for generating the RSSI value that corresponds to the RF signal further involves detecting a signal envelope of the signal that results from the AGC operation.

In an embodiment, the method for generating the RSSI value that corresponds to the RF signal further involves buffering the signal envelope.

In an embodiment, obtaining the ADC code involves converting the buffered signal envelope into the ADC code.

In an embodiment, the method for generating the RSSI value that corresponds to the RF signal further involves placing the RSSI value into an RSSI lookup table.

In an embodiment, a system for generating an RSSI value that corresponds to a radio frequency (RF) signal includes an AGC device configured to obtain an attenuation factor code in response to applying an AGC operation to the RF signal, an ADC device configured to obtain an ADC code in response to applying an ADC operation to a signal that results from the AGC operation, and an RSSI device configured to combine the attenuation factor code and the ADC code to generate an RSSI value.

In an embodiment, the RSSI device is further configured to perform a bit shift operation on the attenuation factor code and the ADC code.

In an embodiment, the number of bits of the RSSI value is equal to the sum of the number of bits of the attenuation factor code and the number of bits of the ADC code.

In an embodiment, the RSSI device is further configured to append the attenuation factor code to the least significant bit (LSB) of the ADC code or append the attenuation factor code to the most significant bit (MSB) of the ADC code.

In an embodiment, the AGC device includes a programmable resistive voltage divider.

In an embodiment, the AGC device includes a programmable capacitive voltage divider.

In an embodiment, the system further includes a signal envelope detector configured to detect a signal envelope of the signal that results from the AGC operation.

In an embodiment, the system further includes a buffer configured to buffer the signal envelope.

In an embodiment, the ADC device is further configured to convert the buffered signal envelope into the ADC code.

In an embodiment, a method for generating an RSSI value that corresponds to an RF signal involves obtaining an attenuation factor code in response to applying an AGC operation to the RF signal, obtaining an ADC code in response to applying an ADC operation to a signal that results from the AGC operation, appending the attenuation factor code to the most significant bit (MSB) of the ADC code to generate an RSSI value, and placing the RSSI value into an RSSI lookup table.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
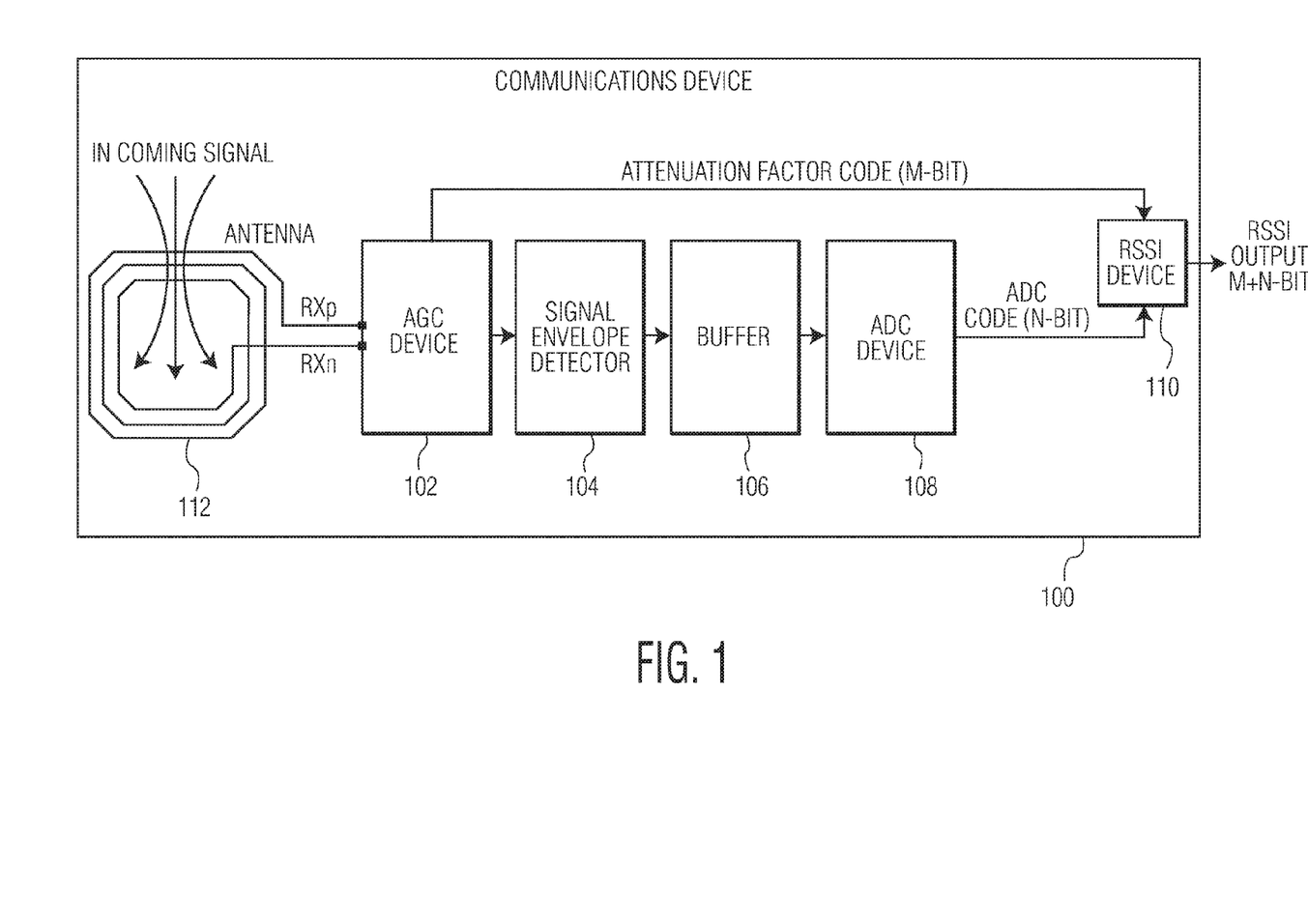
FIG. 1 depicts a communications device in accordance with an embodiment of the invention.

FIG. 1 depicts a communications device 100 in accordance with an embodiment of the invention. In the embodiment depicted in FIG. 1, the communications device includes an automatic gain control (AGC) device 102, a signal envelope detector 104, a buffer 106, an analog-to-digital converter (ADC) device 108, and an RSSI device 110. The communications device is configured to process an RF signal to generate a digital signal. The communications device may be an integrated circuit (IC) device, such as an IC chip. Although the illustrated communications device is shown with certain components and described with certain functionality herein, other embodiments of the communications device may include fewer or more components to implement the same, less, or more functionality. For example, in some embodiments, the communications device may include at least one antenna 112 for the reception of RF signals. In another example, in some embodiments, the communications device may include a digital signal processing (DSP) device configured to process digital signals.

The communications device 100 depicted in FIG. 1 can process an RF signal to generate a digitalized version of the RF signal as well as to generate an RSSI value representing the signal strength of the RF signal. The RSSI value can be used to adjust the communications device to cope with different communications conditions, e.g., long distance communications with bad coupling conditions as well as close distance communications with good coupling conditions. For example, if the signal strength of the received RF signal is low (e.g., as a result of large distance communications with bad coupling conditions), the communications device amplifies the received RF signal with a large amplifier gain. If the signal strength of the received RF signal is high (e.g., as a result of close distance communications with good coupling conditions), the communications device amplifies the received RF signal with a small amplifier gain or attenuates the received RF signal. Consequently, the communications device 100 depicted in FIG. 1 can support a wide dynamic range (i.e., process RF signals with a wide range of amplitudes). Compared to a communications device that implements a separate RSSI measurement device and does not use information gathered by AGC/ADC devices, the communications device 100 depicted in FIG. 1 uses the AGC device 102 and the ADC device 108 to generate RSSI values for received RF signals. Consequently, the communications device 100 depicted in FIG. 1 can be implemented with fewer circuit components and less substrate area (e.g., silicon area). In addition, compared to a communications device that implements a separate RSSI measurement device and does not use information gathered by AGC/ADC devices, the communications device 100 depicted in FIG. 1 can operate with less power consumption, which results in less energy cost and less thermal emission.

The AGC device 102 of the communications device 100 is configured to perform an AGC operation on an RF signal. The AGC operation includes a signal attenuation operation in which the RF signal is attenuated or a signal bypass operation in which the RF signal is not attenuated. In some embodiments, the AGC device is used to automatically attenuate an incoming RF signal from the antenna if the RF signal is larger than a supply range and generate an attenuation factor code that has M bits (where M is a positive integer), which is output to the RSSI device for generating an RSSI value. Without signal attenuation, an RF signal that is larger than the supply range may be clipped by the signal envelope detector 104, resulting in an inaccurate signal strength measurement. In some embodiments, the AGC device is implemented as a programmable resistive voltage divider, a programmable capacitive voltage divider, or a combination of a programmable resistive voltage divider and a programmable capacitive voltage divider.

Figure 2A:
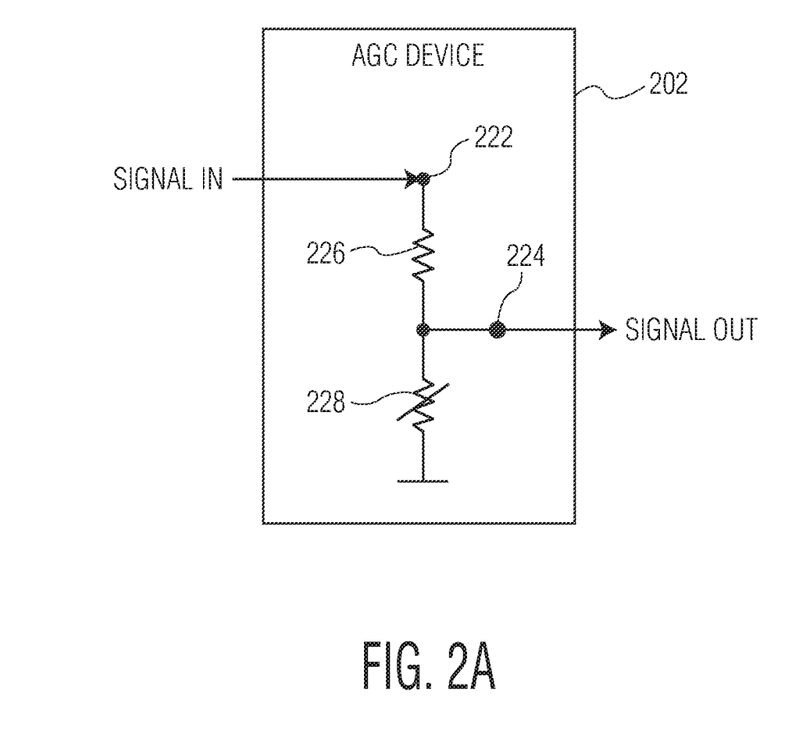
FIG. 2A depicts an embodiment of an AGC device of the communications device depicted in FIG. 1 that is implemented as a programmable resistive voltage divider.

FIG. 2A depicts an embodiment of the AGC device 102 depicted in FIG. 1 that is implemented as an M-bit programmable resistive voltage divider 202. In the embodiment depicted in FIG. 2A, the M-bit programmable resistive voltage divider 202 includes a first resistor 226 with a fixed resistance and an M-bit controlled resistor array 228 with a programmable resistance. The M-bit controlled resistor array is controlled by an M-bit attenuation factor code, which is output to the RSSI device for generating an RSSI value. In an embedment, the M-bit controlled resistor array includes a number of resistors and each of the resistors can be enabled or disabled (e.g., bypassed) by the M-bit attenuation factor code to generate a particular resistance value. The M-bit programmable resistive voltage divider receives an RF signal at an input terminal 222 and outputs an output signal from an output terminal 224. The output signal may be an attenuated version of the received RF signal or identical to the received RF signal. In the M-bit programmable resistive voltage divider depicted in FIG. 2A, the first resistor is connected to the input terminal from which an RF signal is received and the M-bit controlled resistor array is connected to ground. Alternatively, the M-bit controlled resistor array may be connected to the input terminal from which an RF is received and the first resistor is connected to ground. The voltage division ratio of the M-bit programmable resistive voltage divider is adjusted by changing the resistance of the M-bit controlled resistor array. The M-bit programmable resistive voltage divider depicted in FIG. 2A is one possible embodiment of the AGC device 102 depicted in FIG. 1. However, the AGC device 102 depicted in FIG. 1 is not limited to the embodiment shown in FIG. 2A.

Figure 2B:
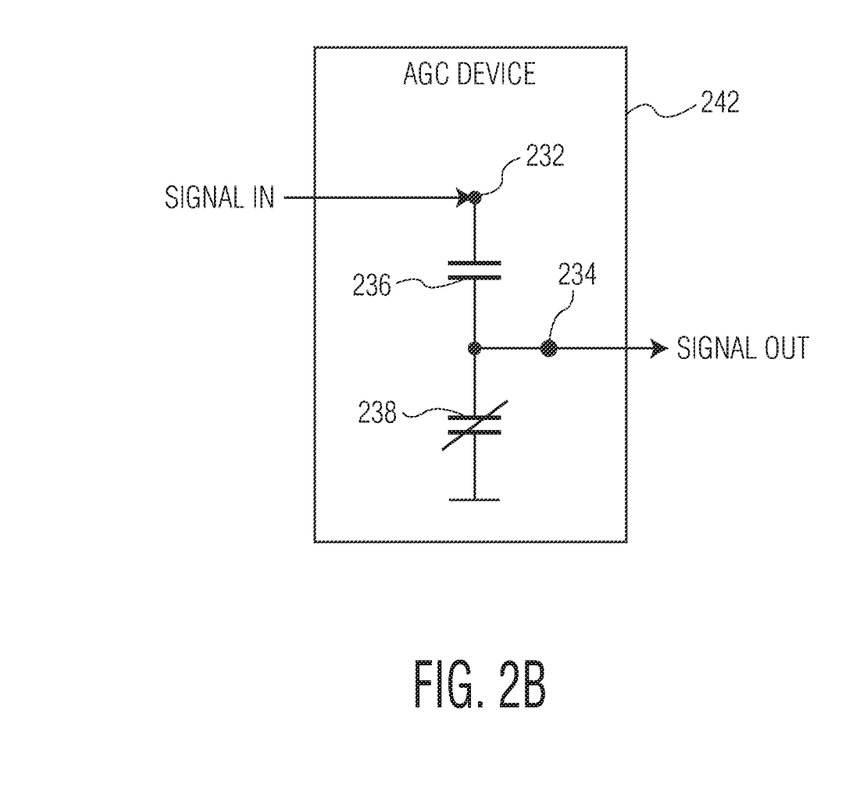
FIG. 2B depicts an embodiment of an AGC device of the communications device depicted in FIG. 1 that is implemented as a programmable capacitive voltage divider.

FIG. 2B depicts an embodiment of the AGC device 102 depicted in FIG. 1 that is implemented as an M-bit programmable capacitive voltage divider 242. In the embodiment depicted in FIG. 2B, the M-bit programmable capacitive voltage divider 242 includes a first capacitor 236 with a fixed capacitance and an M-bit controlled capacitor array 238 with a programmable capacitance. The M-bit controlled capacitance array is controlled an M-bit attenuation factor code, which is output to the RSSI device for generating an RSSI value. In an embedment, the M-bit controlled capacitor array includes a number of capacitors and each of the capacitors can be enabled or disabled (e.g., bypassed) by the M-bit attenuation factor code to generate a particular capacitance value. The M-bit programmable capacitive voltage divider receives an RF signal at an input terminal 232 and outputs an output signal from an output terminal 234. The output signal may be an attenuated version of the received RF signal or identical to the received RF signal. In the M-bit programmable capacitive voltage divider depicted in FIG. 2B, the first capacitor is connected to the input terminal from which an RF signal is received and the M-bit controlled capacitor array is connected to ground. Alternatively, the M-bit controlled capacitor array may be connected to the input terminal from which an RF is received and the first capacitor is connected to ground. The voltage division ratio of the M-bit programmable capacitive voltage divider is adjusted by changing the resistance of the M-bit controlled capacitor array. The M-bit programmable capacitive voltage divider depicted in FIG. 2B is one possible embodiment of the AGC device 102 depicted in FIG. 1. However, the AGC device 102 depicted in FIG. 1 is not limited to the embodiment shown in FIG. 2B.

Turning back to FIG. 1, the signal envelope detector 104 of the communications device 100 is configured to detect the signal envelope of an incoming signal. The signal envelope detector may detect the maximum amplitude of a signal that is output from the AGC device 102. In some embodiments, the signal envelope detector is implemented as a sampling mixer with the same frequency as that of the incoming signal. In these embodiments, the sampling mixer may directly sample signal peaks or perform IQ sampling and subsequently calculate the geometric sum. In some embodiments, the signal envelope detector is implemented as a peak detector.

The buffer 106 of the communications device 100 is configured to buffer or temporarily store the detected signal envelope from the signal envelope detector 104. The buffer can be used to prevent the ADC sampling kickback and to increase reverse isolation. In some embodiments, the buffer is implemented as a unity gain buffer, a fixed gain buffer, a transition gate, a switch, or a combination of a unity gain buffer, a fixed gain buffer, a transition gate, and/or a switch.

Figure 3A:
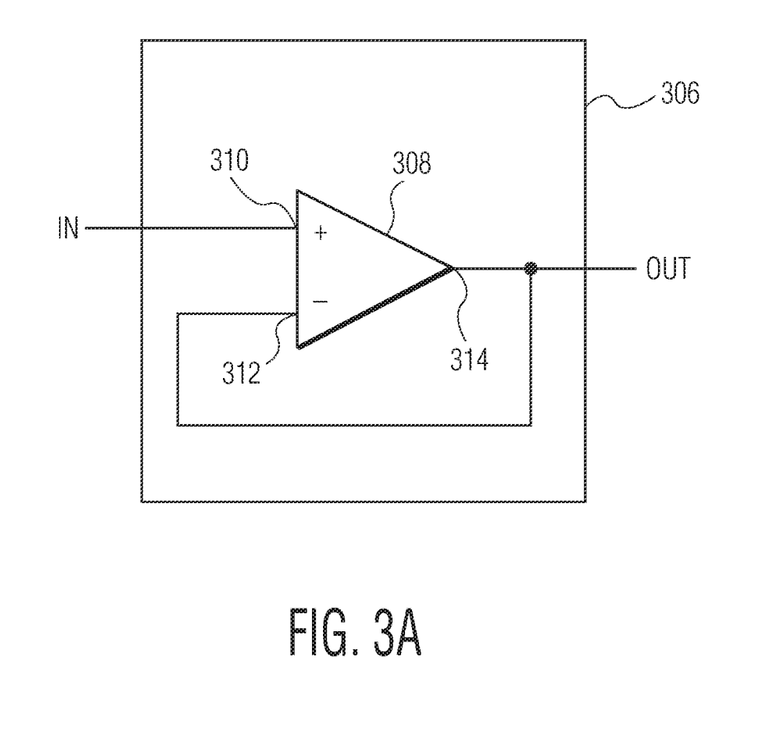
FIGS. 3A-3D depict some embodiments of a buffer of the communications device depicted in FIG. 1.

FIG. 3A depicts an embodiment of the buffer 106 that is implemented as a unity gain buffer 306. In the embodiment depicted in FIG. 3A, the unity gain buffer 306 includes an amplifier 308 having a first input terminal 310 used to receive the detected signal envelope from the signal envelope detector 104 and a second input terminal 312 that is connected to an output terminal 314 of the unity gain buffer. The unity gain buffer depicted in FIG. 3A is one possible embodiment of the buffer 106 depicted in FIG. 1. However, the buffer 106 depicted in FIG. 1 is not limited to the embodiment shown in FIG. 3A.

Figure 3B:
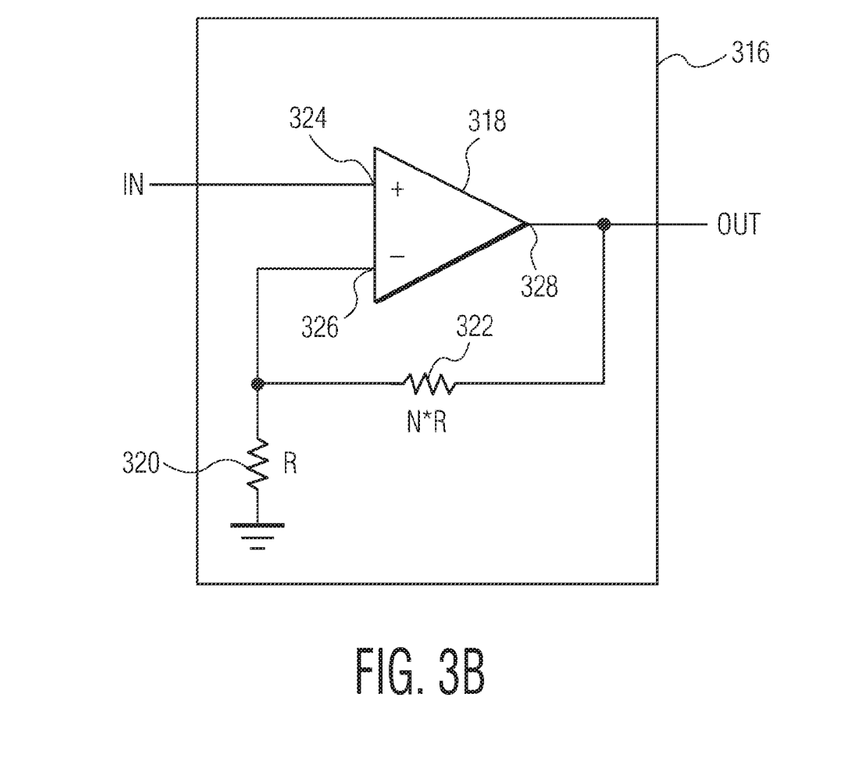

FIG. 3B depicts an embodiment of the buffer 106 that is implemented as a fixed gain buffer 316. In the embodiment depicted in FIG. 3B, the fixed gain buffer 316 includes an amplifier 318, a first resistor 320, and a second resistor 322. The amplifier includes a first input terminal 324 used to receive the detected signal envelope from the signal envelope detector 104 and a second input terminal 326 that is connected to ground through the first resistor and connected to an output terminal 328 of the fixed gain buffer through the second resistor. The fixed gain buffer depicted in FIG. 3B is one possible embodiment of the buffer 106 depicted in FIG. 1. However, the buffer 106 depicted in FIG. 1 is not limited to the embodiment shown in FIG. 3B.

Figure 3C:
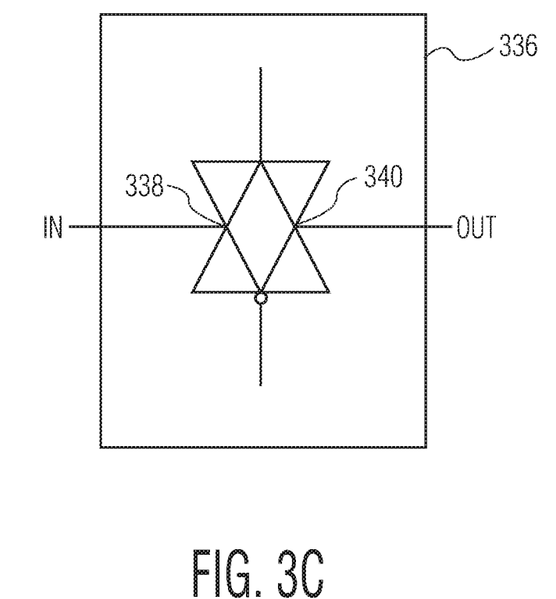

FIG. 3C depicts an embodiment of the buffer 106 that is implemented as a transition gate 336. In the embodiment depicted in FIG. 3C, the transition gate 336 includes an input terminal 338 used to receive the detected signal envelope from the signal envelope detector 104 and an output terminal 340 from which the buffered signal envelope is output. The transition gate depicted in FIG. 3C is one possible embodiment of the buffer 106 depicted in FIG. 1. However, the buffer 106 depicted in FIG. 1 is not limited to the embodiment shown in FIG. 3C.

Figure 3D:
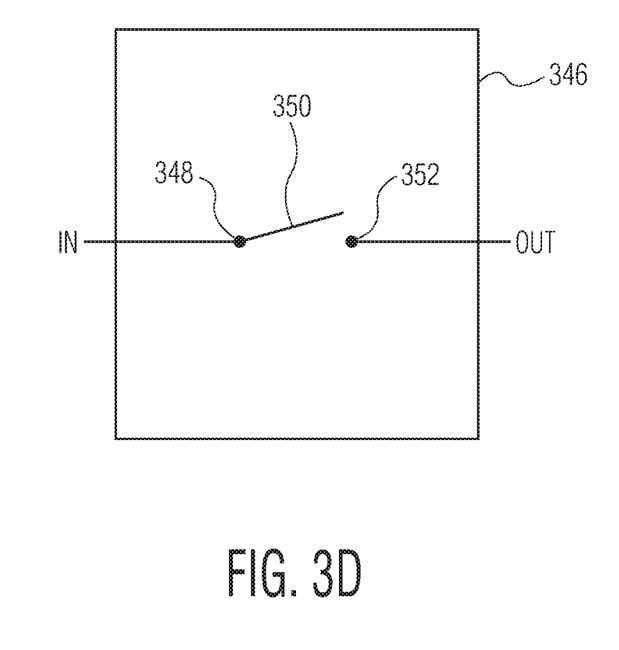

FIG. 3D depicts an embodiment of the buffer 106 that is implemented as a switch 346. In the embodiment depicted in FIG. 3D, the switch 346 includes an input terminal 348 used to receive the detected signal envelope from the signal envelope detector 104, a switching device or switching mechanism 350, and an output terminal 352 from which the buffered signal envelope is output. In some embodiments, the switch can be implemented as a semiconductor device, such as a field-effect transistor (FET) device. The switch depicted in FIG. 3D is one possible embodiment of the buffer 106 depicted in FIG. 1. However, the buffer 106 depicted in FIG. 1 is not limited to the embodiment shown in FIG. 3D.

Turning back to FIG. 1, the ADC device 108 of the communications device 100 is configured to convert an analog signal into a digital signal. In some embodiments, the ADC device converts the buffered signal envelope from the buffer into an N-bit (where N is a positive integer) ADC code, which is output to the RSSI device for generating an RSSI value. Examples of the ADC device include, without being limited to, a direct-conversion ADC, a successive-approximation ADC, a ramp-compare ADC, a delta-encoded ADC and a sigma-delta ADC.

The RSSI device 110 of the communications device 100 is configured to obtain an RSSI value based on the attenuation factor code from the AGC device 102 and the ADC code from the ADC device 108. The RSSI value generated by the RSSI device may be used to control an electronic device, such as an amplifier. For example, the RSSI value generated by the RSSI device is used to control the gain of an amplifier within a receiver device or a transmitter device. When the distance is close enough between a reader and a contactless card, the gain of a card receiver can be decreased to avoid card receiver saturation and the transmitting power of a card transmitter can be decreased to avoid card receiver saturation. When the distance is far away between a card reader and a contactless card, the gain of a card receiver can be increased to achieve better sensitivity and the transmitting power of a card transmitter can be increased to achieve a larger communication distance.

In some embodiments, the RSSI device 110 switches automatically between two operating ranges. In an AGC operation range in which the field induced voltage is larger than a certain value (e.g., the voltage at RXP/RXN of the AGC device 102 is above 1.2 volts), the AGC device operates to attenuate an RF signal. The voltage division ratio can be controlled by an M-bit attenuation factor code until a targeted voltage is reached. The M-bit attenuation factor code is used to calculate the incoming signal strength. Within a communications device having a specific antenna and matching system, the relationship between the signal field strength and the induced voltage may be fixed such that the RSSI value can be mapped inside of a lookup table with signal field strength. In an ADC operation range in which the field induced voltage on RX is smaller than a certain value, the AGC device does not perform signal attenuation (attenuation factor code being 0), and the ADC code can be used to evaluate the received field strength value.

In some embodiments, the RSSI device 110 combines an M-bit attenuation factor code and an N-bit ADC code to generate an RSSI value of M+N bits. For example, the RSSI device may perform a bit shift operation to append the M-bit attenuation factor code to the lowest bit (e.g., the least significant bit (LSB) bit) of the N-bit ADC code or to append the M-bit attenuation factor code to the highest bit (e.g., the most significant bit (MSB) bit) of the N-bit ADC code.

Figure 4:
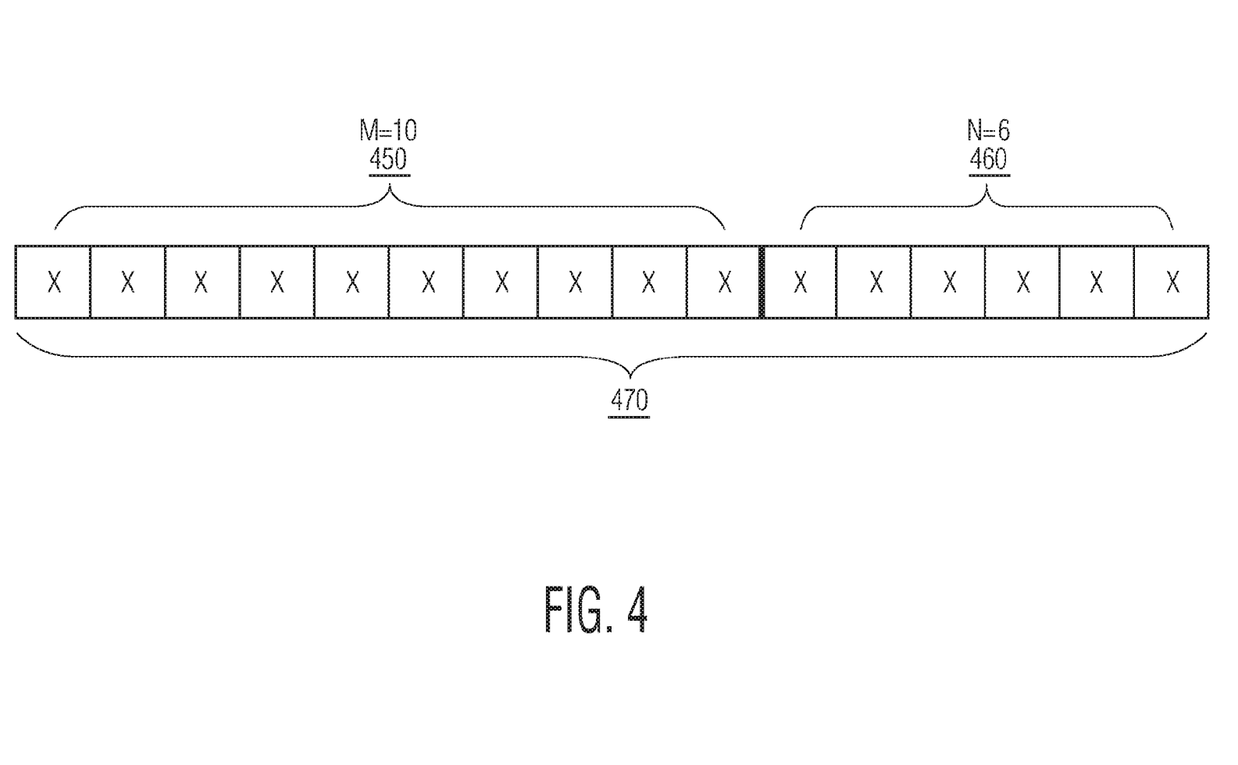
FIG. 4 depicts an example an RSSI value of an RSSI device of the communications device depicted in FIG. 1.

FIG. 4 depicts an example an RSSI value of the RSSI device 110 of the communications device 100 depicted in FIG. 1. In the example depicted in FIG. 4, the RSSI device appends a 10-bit attenuation factor code 450 to the highest bit of a 6-bit ADC code 460 to generate an RSSI value 470 of 16 bits. For example, the RSSI device appends a 10-bit attenuation factor code of "0000000001" to the highest bit of a 6-bit ADC code of "111000" to generate a 16-bit RSSI value of "0000000001111000." In another example, the RSSI device appends a 10-bit attenuation factor code of "0000000000" to the highest bit of a 6-bit ADC code of "111111" to generate a 16-bit RSSI value of "0000000000111111." The RSSI values can be used to adjust the communications device or other communications device operably connected to the communications device in response to communication conditions.

The RSSI device 110 may place a generated RSSI value in a lookup table for a targeted antenna and matching setting. The lookup table can be generated by different algorithms with different sizes. In some embodiments, the RSSI device generates a lookup table directly with each M-bit attenuation factor code and each N-bit ADC code, resulting in a lookup table size of $2^{M+N}$. In some embodiments, the RSSI device generates a lookup table for the M-bit attenuation factor code and a lookup table for the N-bit ADC code, resulting in a total lookup table size of $2^M+2^N$. In some embodiments, the RSSI device uses an interpolating method to reduce the lookup table. For example, the RSSI device selects one or more of the M-bit attenuation factor codes and the N-bit ADC codes to generate a lookup table. In some embodiments, the RSSI device uses a polynomial curve fitting method to reduce the size of a lookup table. For example, the ADC code can be characterized by a 3 point linear curve, $$y = a \cdot x + b \quad (1)$$

where x represents the input voltage or the field strength, parameters a and b are saved in the lookup table. The attenuation factor code can be characterized by 3 order polynomial equation, $$y = a \cdot x^3 + b \cdot x^2 + c \cdot x + d \quad (2)$$

where x represents the input voltage or the field strength, parameters a, b, c, d are saved in the lookup table. In some embodiments, an input voltage/field strength curve is calculated as follows. In the ADC range (AGC=0, no attenuation), the input voltage/field strength can be expressed as:

$$V_{IN} = V_{LSB} * N \quad (3)$$

where $V_{IN}$ represents the input voltage/field strength, $V_{LSB}$ represents a unit ADC least significant bit (LSB) voltage, and the ADC device 108 has N bits. In the AGC range, the input voltage/field strength can be expressed as:

$$V_{IN} = V_{LSB} * N * Att_M \quad (4)$$

where $V_{IN}$ represents the input voltage/field strength, $V_{LSB}$ represents a unit ADC LSB voltage, $Att_M$ represents the nominal attenuation factor code, and the ADC device has N bits. After the input voltage curve is generated, a linear fit curve between the true input voltage and typically calculated curve can be calculated. The RSSI device can use a second order polynomial curve ($y = a \cdot x^2 + b \cdot x + c$) for the attenuation factor code and a first order linear curve ($y = a \cdot x + b$) for the input voltage In an example operation of the communications device 100, the AGC device 102 obtains an attenuation factor code in response to applying an AGC operation to an RF signal. The ADC device 108 obtains an ADC code in response to applying an ADC operation to a signal that results from the AGC operation. The RSSI device 110 combines the attenuation factor code and the ADC code to generate an RSSI value that corresponds to the RF signal.

Figure 5A:
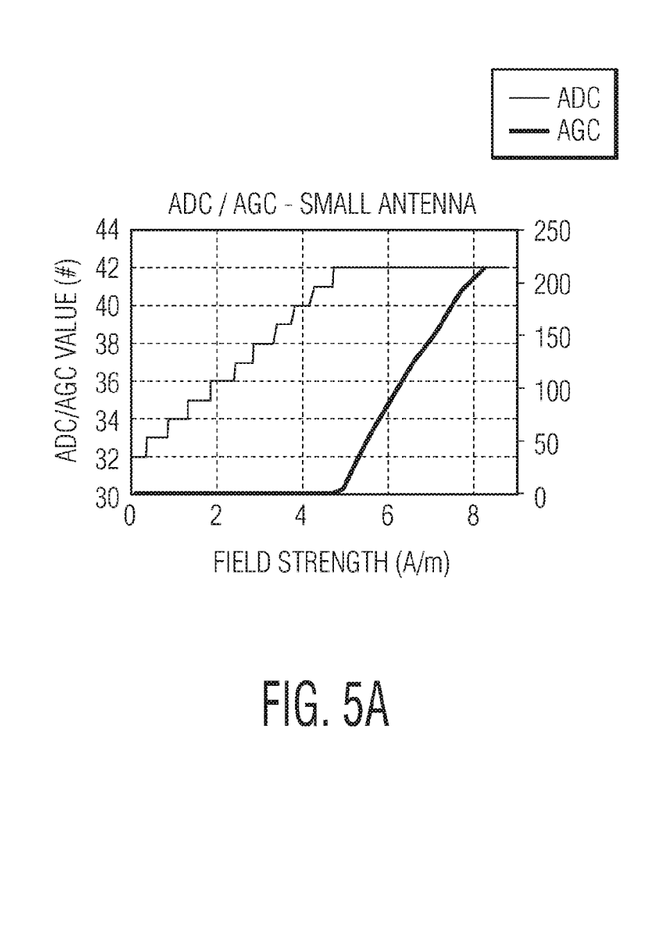
FIG. 5A illustrates some results of ADC output and AGC output with a small antenna.
Figure 5B:
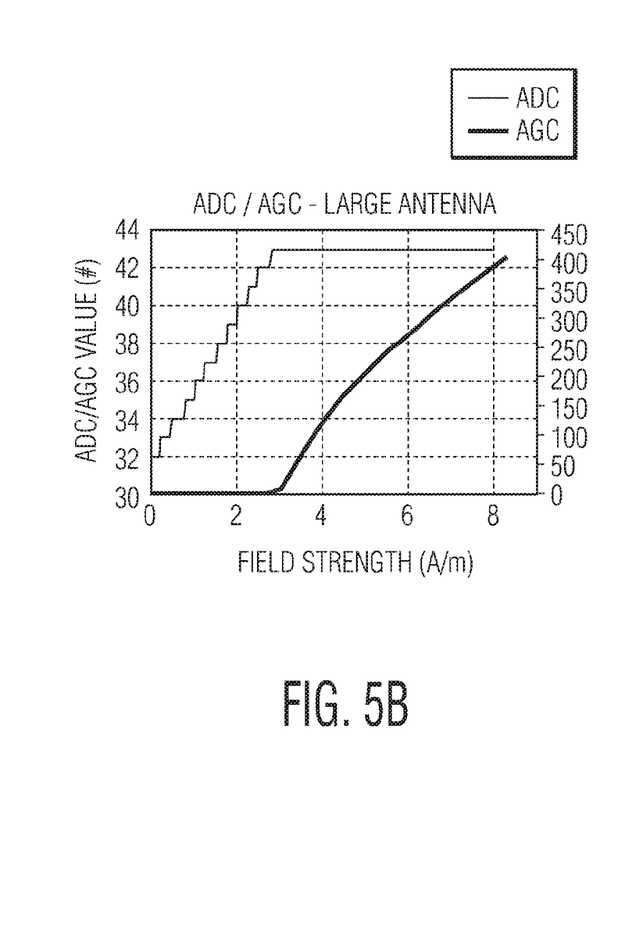
FIG. 5B illustrates some results of ADC output and AGC output with a large antenna.

FIG. 5A illustrates some results of ADC output and AGC output with a small antenna and FIG. 5B illustrates some results of ADC output and AGC output with a large antenna. As shown in FIGS. 5A and 5B, there is no overlap between the AGC operation range and the ADC operation range for small and large antennas. Consequently, the communications device 100 can seamlessly switch between the AGC operation range and the ADC operation range.

Figure 6:
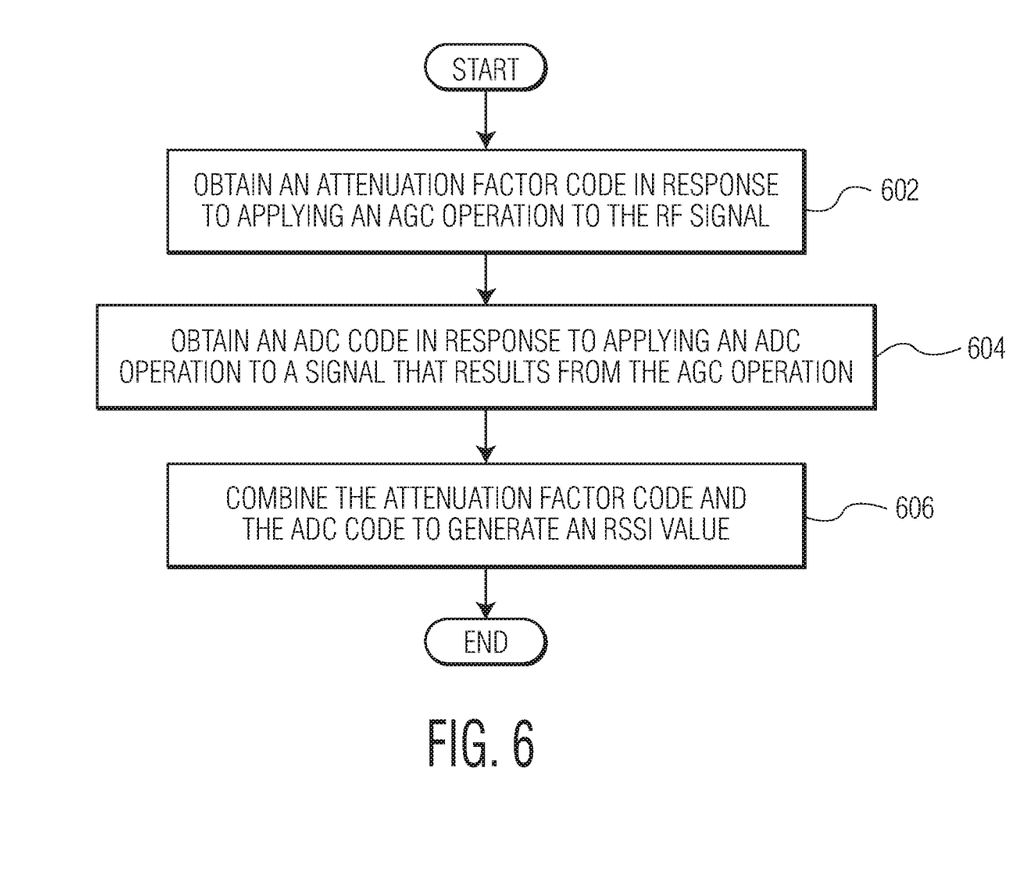
FIG. 6 is a process flow diagram of a method for generating an RSSI value that corresponds to an RF signal in accordance with an embodiment of the invention.

FIG. 6 is a process flow diagram of a method for generating an RSSI value that corresponds to an RF signal in accordance with an embodiment of the invention. At block 602, an attenuation factor code is obtained in response to applying an AGC operation to the RF signal. At block 604, an ADC code is obtained in response to applying an ADC operation to a signal that results from the AGC operation. At block 606, the attenuation factor code and the ADC code are combined to generate an RSSI value.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for generating a received signal strength indicator (RSSI) value that corresponds to a radio frequency (RF) signal, the method comprising:
   obtaining an attenuation factor code in response to applying an automatic gain control (AGC) operation to the RF signal;
   obtaining an analog-to-digital converter (ADC) code in response to applying an ADC operation to a signal that results from the AGC operation; and
   combining the attenuation factor code and the ADC code to generate an RSSI value, wherein combining the attenuation factor code and the ADC code to generate the RSSI value comprises performing a bit shift operation on the attenuation factor code and the ADC code, and wherein the number of bits of the RSSI value is equal to the sum of the number of bits of the attenuation factor code and the number of bits of the ADC code.

2. The method of claim 1, wherein performing the bit shift operation on the attenuation factor code and the ADC code comprises one of appending the attenuation factor code to the least significant bit (LSB) of the ADC code and appending the attenuation factor code to the most significant bit (MSB) of the ADC code.

3. The method of claim 1, wherein obtaining the attenuation factor code comprises obtaining the attenuation factor code using a programmable resistive voltage divider.

4. The method of claim 1, wherein obtaining the attenuation factor code comprises obtaining the attenuation factor code using a programmable capacitive voltage divider.

5. The method of claim 1, further comprising detecting a signal envelope of the signal that results from the AGC operation.

6. The method of claim 5, further comprising buffering the signal envelope.

7. The method of claim 6, wherein obtaining the ADC code comprises converting the buffered signal envelope into the ADC code.

8. The method of claim 1, further comprising placing the RSSI value into an RSSI lookup table.

9. A system for generating a received signal strength indicator (RSSI) value that corresponds to a radio frequency (RF) signal, the system comprising:
   an automatic gain control (AGC) device configured to obtain an attenuation factor code in response to applying an AGC operation to the RF signal;
   an analog-to-digital converter (ADC) device configured to obtain an ADC code in response to applying an ADC operation to a signal that results from the AGC operation; and
   an RSSI device configured to combine the attenuation factor code and the ADC code to generate an RSSI value, wherein the RSSI device is further configured to perform a bit shift operation on the attenuation factor code and the ADC code, and wherein the number of bits of the RSSI value is equal to the sum of the number of bits of the attenuation factor code and the number of bits of the ADC code.

10. The system of claim 9, wherein the RSSI device is further configured to append the attenuation factor code to the least significant bit (LSB) of the ADC code or append the attenuation factor code to the most significant bit (MSB) of the ADC code.

11. The system of claim 9, wherein the AGC device comprises a programmable resistive voltage divider.

12. The system of claim 9, wherein the AGC device comprises a programmable capacitive voltage divider.

13. The system of claim 9, further comprising a signal envelope detector configured to detect a signal envelope of the signal that results from the AGC operation.

14. The system of claim 13, further comprising a buffer configured to buffer the signal envelope.

15. The system of claim 14, wherein the ADC device is further configured to convert the buffered signal envelope into the ADC code.

16. A method for generating a received signal strength indicator (RSSI) value that corresponds to a radio frequency (RF) signal, the method comprising:
   obtaining an attenuation factor code in response to applying an automatic gain control (AGC) operation to the RF signal;
   obtaining an analog-to-digital converter (ADC) code in response to applying an ADC operation to a signal that results from the AGC operation;
   appending the attenuation factor code to the most significant bit (MSB) of the ADC code to generate an RSSI value; and
   placing the RSSI value into an RSSI lookup table.

* * * * *